United States Patent
Blanchette et al.

[11] Patent Number: 5,357,389
[45] Date of Patent: Oct. 18, 1994

[54] ALUMINA MATERIAL USEFUL WITH THIN FILM HEADS

[75] Inventors: Curtis N. Blanchette, Los Gatos; David P. Maddex; Richard F. Shimek, both of San Jose, all of Calif.

[73] Assignee: Read-Rite Corporation, Milpitas, Calif.

[21] Appl. No.: 100,212

[22] Filed: Aug. 2, 1993

Related U.S. Application Data

[62] Division of Ser. No. 786,095, Oct. 31, 1991, Pat. No. 5,256,266.

[51] Int. Cl.$^5$ ............................................. G11B 5/235
[52] U.S. Cl. ..................................................... 360/120
[58] Field of Search ............................. 360/126, 120

[56] References Cited

U.S. PATENT DOCUMENTS 3,676,610  7/1972  Moss ................................... 360/125
4,859,638  8/1989  Wada ................................... 501/58

Primary Examiner—A. J. Heinz
Attorney, Agent, or Firm—Nathan N. Kallman

[57] ABSTRACT

A process for sputtering and depositing sputtered alumina uses a mixture of two gases, preferably argon and air, for the deposition phase. No external heat is supplied to the sputtering system during the presputtering, sputter etch and deposition phases of the process. The alumina that is produced is crypto-crystalline and is characterized by crystal size of less than one micron. The alumina is very hard, impervious to attack by acid or base solutions and has improved machining qualities. The alumina is useful as a transducing gap layer in a thin film magnetic head.

2 Claims, 3 Drawing Sheets

ALUMINA MATERIAL USEFUL WITH THIN FILM HEADS

This application is a division of application Ser. No. 07/786,095, filed Oct. 31, 1991 U.S. Pat. No. 5,256,266.

FIELD OF THE INVENTION

This invention relates to a process for making an improved aluminum oxide (alumina) material and in particular to the use of an improved alumina in thin film magnetic heads.

DESCRIPTION OF THE PRIOR ART

Thin film heads are typically formed with a substrate on which pole pieces P1 and P2 are deposited. A nonmagnetic layer, which typically is an alumina layer, forms a transducing gap between the P1 and P2 poles. A protective overcoat layer, which also is made from alumina, is provided over the thin film head structure. The insulating alumina material presently used for thin film heads is amorphous, is relatively soft, and subject to attack by acid or base solutions that are used during the deposition and formation of the various layers of the thin film heads.

The prior art approach to sputtering and deposition of an etch resistant alumina suggested for the production of thin film heads requires high temperatures, in the range of 450 C.–500 C. by way of example. An argon gas is supplied to the sputtering system to implement the etching and deposition steps of the alumina on the substrate. The r.f. sputtering of alumina is described in an article entitled "Evaluating RF Sputtered $Al_2O_3$ for Microcircuit Fabrication", by T. N. Kennedy, published in Electronic Packaging and Production, December, 1974, pages 136–141; and in an article entitled "Stability of rf-sputtered aluminum oxide" by R. A. Gardner et al., published in J. Vac. Sci. Technol., Vol. 14, No. 5, Sept./Oct. 1977, pages 1139–1145. The processes described use argon gas and operate at relatively high temperatures for sputtering the alumina material.

With prior art alumina materials that are etchable, wafers used for thin film head substrates that are reworked generally experience low gap thickness resulting from material loss after gap deposition. These defective reworked heads are subject to rejection and need to be discarded which reduces the overall production yield. It is desirable to control the final gap thickness within tight tolerances when depositing the gap layer.

SUMMARY OF THE INVENTION

An object of this invention is to provide an alumina material which is relatively hard and durable and not subject to degradation by acid or alkaline solutions.

Another object of this invention is to provide an alumina material that enables control of gap thickness during deposition of the transducing gap layer of a thin film head.

Another object is to provide an improved alumina material that is sputtered at the ambient temperature within a sputtering chamber without the need of an external heat supply.

A further object is to provide an alumina material that has minimal structural flaws and lends itself to optimal machining.

According to this invention, a crypto-crystalline alumina material, which matches the characteristics of corundum or sapphire, is produced in a sputtering chamber. A crypto-crystalline material is defined as one that has a crystalline structure so fine that no distinct particles are recognizable under a microscope. Crypto-crystalline material comprises very small crystals which are 1 micron or less and of molecular size. The crypto-crystalline alumina has characteristicss that make it impervious to chemical etchants, except for relatively strong bases. The crypto-crystalline alumina is produced in a sputtering and deposition system by a sequence of presputtering, sputter etch precleaning of the production material, and deposition of alumina in an atmosphere of a gas mixture of argon and air. The process is implemented without supplying additional heat from a source external to the sputtering and deposition chamber. The alumina material that is produced and deposited has virtually no structural flaws and is not brittle and therefore can be machined without damage. The deposition process allows a controlled deposition during production of the transducing gap of a thin film head whereby a desired final gap thickness is realized.

DESCRIPTION OF THE PREFERRED EMBODIMENT

Figure 1:
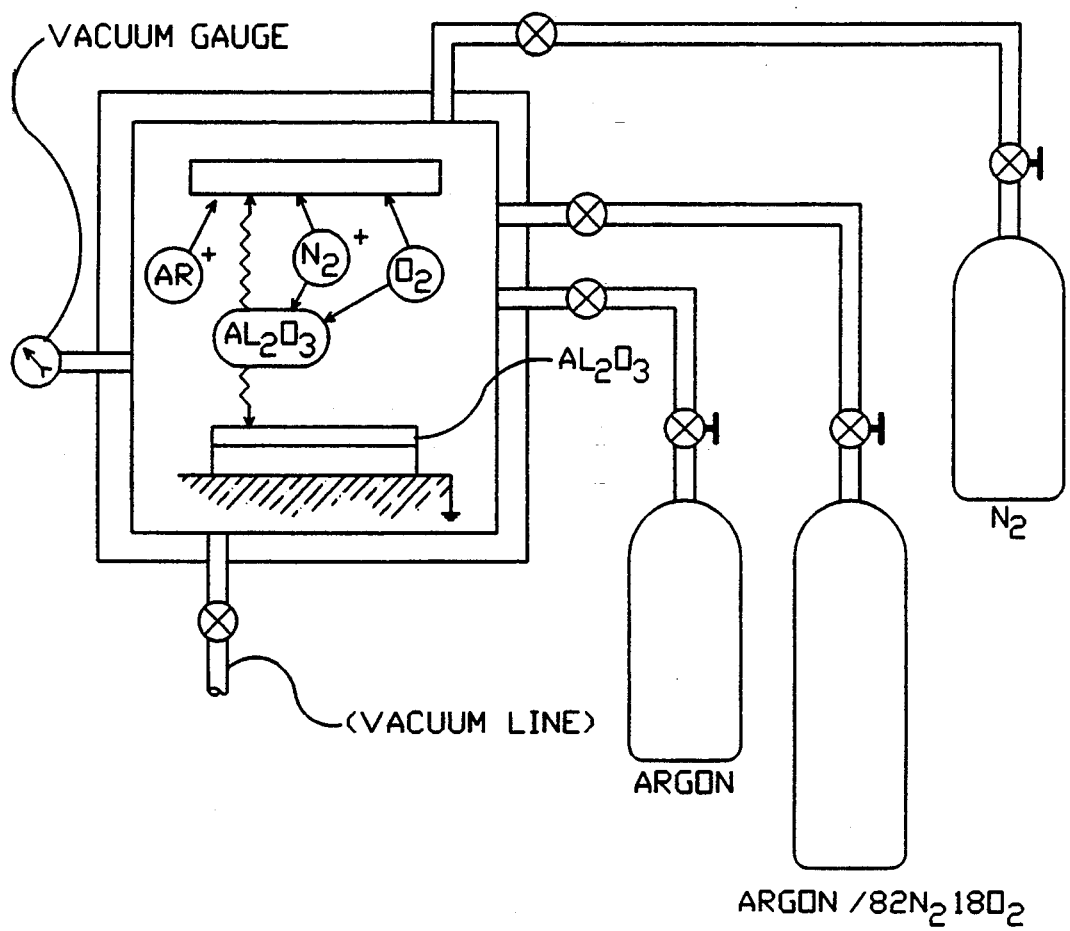
FIG. 1 illustrates a typical sputtering system, such as may be used for producing the improved alumina material of this invention.
Figure 2:
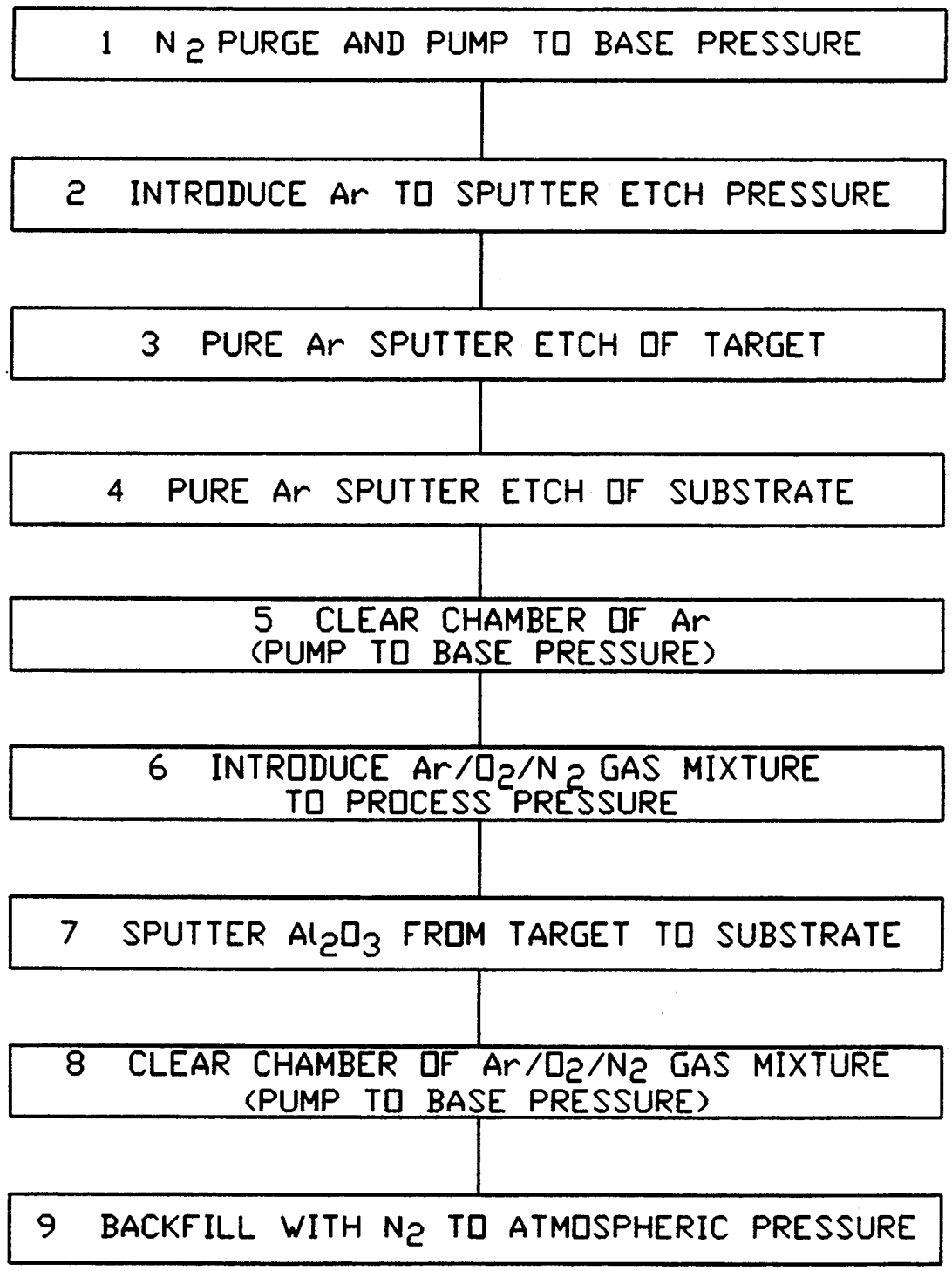
FIG. 2 is a process flow diagram showing steps used with the sputtering system of FIG. 1 to produce the novel alumina material.
Figure 3:
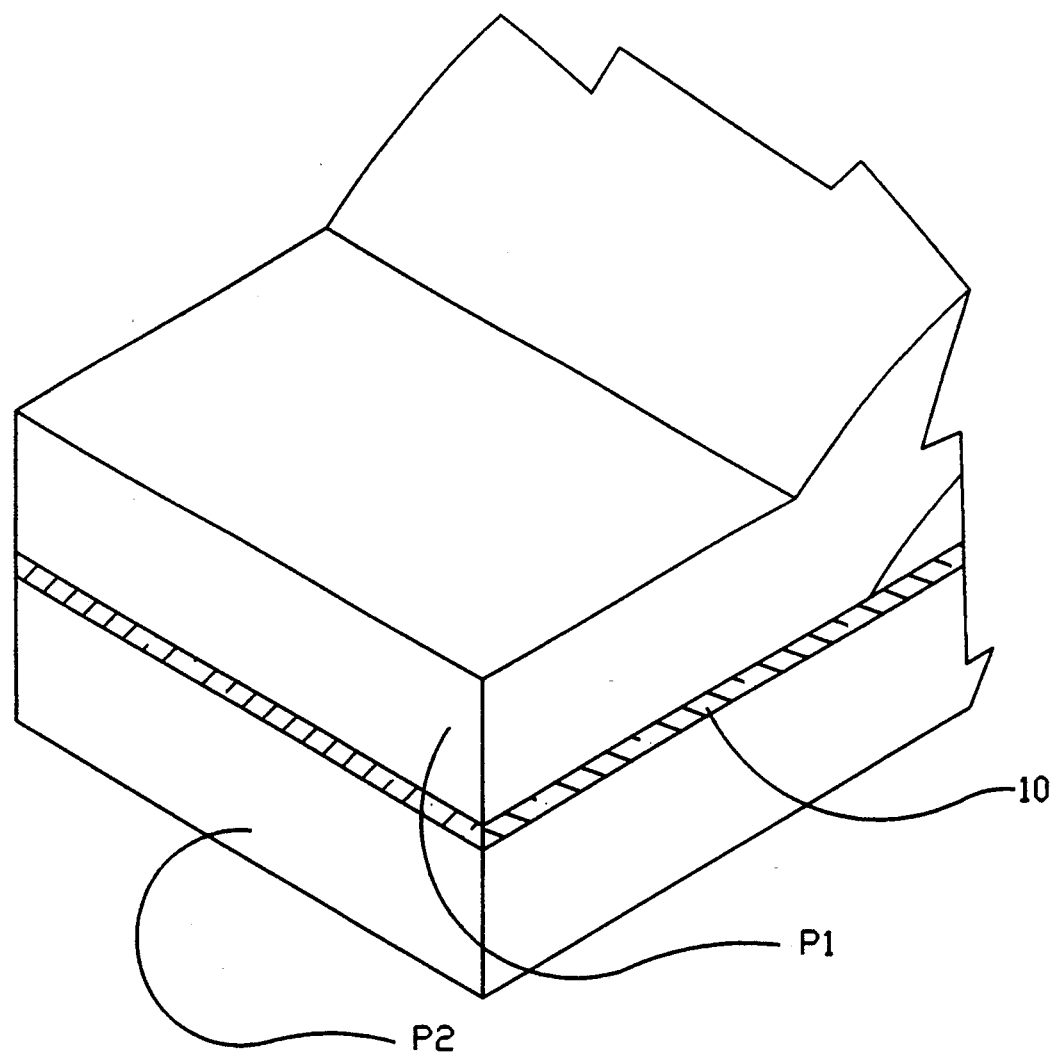
FIG. 3 is an isometric representation, partly broken away, depicting a portion of a thin film magnetic head that includes the alumina material in the transducing gap between the magnetic poles P1 and P2.

In accordance with this invention, a crypto-crystalline alumina material is produced by a process comprising the steps of presputtering, sputter etch production material preclean of an aluminum oxide target followed by deposition of the sputtered alumina. In a preferred application of the invention, a layer of the alumina is deposited over the first pole piece P1 of a thin film transducer or head that has been previously deposited over a ceramic substrate. The alumina layer serves as the nonmagnetic transducing gap of the magnetic head.

To produce the desired alumina material, an AC sputtering system, such as Alcatel Comptech Model 2440 or 2450, is used. A target of 99.995% pure aluminum oxide is positioned within the interior of the sputtering chamber. A substrate, typically made of a ceramic having about 20% titanium carbide and 80% aluminum oxide for example, is located in juxtaposition to the target. The alumina material which is sputtered from the target is deposited onto the thin film P1 layer on the substrate, as is well known in the art.

The process starts with a presputter mode in which Argon in the amount of 140.0 SCCM is introduced into the sputtering system. With a pressure of about 20 mTorr, a target bias of about $-1005$ volts, and target power of approximately 2 kilowatts, sputtering of the aluminum oxide target is implemented for about 10 minutes. The presputter mode is followed by a sputter etch mode in which the substrate bias is approximately $-716$ volts, the substrate power is about 755 watts. The sputter etching is implemented in an argon atmosphere. The sputter etch mode lasts for about two minutes. Target value is 100 to 150 Angstroms removal.

After the sputter etch mode, the sputtering system is switched to a manual mode and allowed to pump down to operating base pressure which is $5.0 \times 10^{-4}$ Torr, and then switched to the argon/air mixture. To provide the gas mixture for use in the sputtering chamber, a mass flow controller is used to determine the ratio of argon to air. The sputtering system preferably is fitted with a two position "Y" valve to allow manual selection of either argon or an argon/air mixture. The ratio of the mixture is controlled by the mass flow controller disposed on the argon line and by a needle valve monitored by a calibrated mass flow meter on the ultra-pure air line. A preferred gas mixture is about 95% argon (ultra-pure or sputtering grade) and about 5.0% ultra-pure synthetic air.

After the proper flows are set for each gas, the flow is allowed to run for five minutes before starting the deposition mode, thereby purging the system of excess argon from the sputter etch mode. The deposition step is achieved with an argon/air mixture of about 140.0/7.0 SCCM, a pressure of about 32 mTorr±7 mTorr, a target bias of about −810 volts, a substrate bias of about −130 volts ±30 volts, a substrate power of approximately 285 watts and a relatively low target power density of 6 to 13 watts/square inch. Deposition rate for this step is about 70 Angstroms/minute. During the entire process of presputtering, sputter etch and deposition, no heat is added to the system from an external heat supply. The temperature within the sputtering chamber as measured adjacent to the substrate or wafer was measured to be less than 90 C. The deposition of alumina on the substrate includes the step of introducing a gas mixture at a pressure greater than the pressure used during sputter etching for a time greater than the time used for presputtering the aluminum oxide target.

The alumina material that is produced has a crystal grain structure less than 1 micron and has a crystal phase which matches that of corundum or sapphire. A film of the alumina material is transparent with no apparent grain or flaws when examined under high magnification optical inspection. An x-ray diffraction analysis of the film on a substrate shows that the film is made primarily of a crypto-crystalline form of aluminum oxide, similar to corundum or sapphire.

An extremely thin layer of the alumina material has been found to be impervious to acid solutions and appears to etch only in concentrated base solutions. In steps subsequent to deposition, such as depositing and forming the electrical coil, the P2 pole piece and insulating layers including the overcoat protective layer, the alumina cannot be etched further and the established final gap thickness is not changed. Thus during batch production of thin film heads and sliders, using the process and alumina material defined herein, the thickness of the head gaps are substantially uniform. A discrete sharp boundary is formed at the gap/pole boundary so that pole thickness is controlled to tight tolerances. The alumina material when deposited on a ceramic substrate used for making head sliders is easy to machine and not subject to breakage or chipping when the slider is lapped or polished or otherwise machined.

It should be understood that the alumina material disclosed herein is not limited in application to the transducing gap of a thin film head, but can be used for other insulating layers with magnetic heads or other devices requiring insulating components or very hard material matching corundum. Also the process for making the novel alumina material is not restricted to the specific parameters of temperature, pressure, voltages, process times, and the like, which may be varied within the scope of the present invention.

What is claimed is:
1. A thin film magnetic head comprising:
first and second magnetic pole layers for providing magnetic flux;
a nonmagnetic transducing gap layer disposed between said magnetic layers, said gap layer being formed of a crypto-crystalline alumina material having crystal grain sizes less than 1 micron and of molecular size.
2. A thin film magnetic head as in claim 1, wherein said alumina material has a crystal phase substantially matching that of corundum.

* * * * *